(12) United States Patent
Lee

(10) Patent No.: US 7,952,948 B2
(45) Date of Patent: May 31, 2011

(54) SEMICONDUCTOR MEMORY APPARATUS

(75) Inventor: Jun Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/495,026

(22) Filed: Jun. 30, 2009

(65) Prior Publication Data

US 2010/0157643 A1 Jun. 24, 2010

(30) Foreign Application Priority Data

Dec. 23, 2008 (KR) .................. 10-2008-0132337

(51) Int. Cl.
*G11C 7/02* (2006.01)

(52) U.S. Cl. ........ 365/206; 365/191; 365/194; 375/211; 375/214; 326/63; 326/86

(58) Field of Classification Search .......... 365/206, 365/191, 194; 375/211, 214; 326/63, 86
See application file for complete search history.

(56) References Cited

U.S. PATENT DOCUMENTS

| | | | | |
|---|---|---|---|---|
| 6,144,590 A * | 11/2000 | Markert et al. | ............... | 365/190 |
| 6,359,471 B1 * | 3/2002 | Mueller et al. | ............... | 326/81 |
| 6,434,081 B1 * | 8/2002 | Johnson et al. | ............. | 365/233.14 |
| 6,460,143 B1 * | 10/2002 | Howard et al. | ............... | 713/323 |
| 6,597,197 B1 * | 7/2003 | Mosley et al. | ............... | 326/63 |
| 6,662,271 B2 * | 12/2003 | Smits | ............. | 711/118 |
| 6,744,810 B1 * | 6/2004 | Iyer et al. | ............. | 375/214 |
| 6,854,030 B2 | 2/2005 | Perino et al. | | |
| 7,052,967 B2 | 5/2006 | Lee et al. | | |
| 7,454,535 B2 * | 11/2008 | Hwang et al. | ............... | 710/51 |
| 7,545,205 B2 * | 6/2009 | Tang et al. | ............... | 327/565 |

FOREIGN PATENT DOCUMENTS

| | | |
|---|---|---|
| JP | 2000-029925 | 1/2000 |
| JP | 2002-368087 | 12/2002 |
| JP | 2005-197637 | 7/2005 |

* cited by examiner

*Primary Examiner* — Viet Q Nguyen

(74) *Attorney, Agent, or Firm* — Venable LLP; Jeffri A. Kaminski

(57) ABSTRACT

A semiconductor memory apparatus includes non-inversion repeaters that non-invert data and output the inverted data; and inversion repeaters that invert data and output the inverted data. The non-inversion repeaters or the inversion repeaters are arranged on a first data line and a second data line at a predetermined distance, respectively, which are parallel with each other and the most adjacent to each other and the non-inversion repeater or the inversion repeater is arranged at first positions corresponding to the first data line and the second data line, respectively. The non-inversion repeaters are arranged on one of the first data line and the second data line while the inversion repeaters are arranged on the other first data line and the second data line, at second positions except for the first arrangement positions of positions corresponding to the first data line and the second data line, respectively.

4 Claims, 2 Drawing Sheets

SEMICONDUCTOR MEMORY APPARATUS

CROSS-REFERENCES TO RELATED PATENT APPLICATION

The present application claims priority under 35 U.S.C 119(a) to Korean Application No. 10-2008-0132337, filed on Dec. 23, 2008, in the Korean Intellectual Property Office, which is incorporated herein by reference in its entirety as set forth in full.

BACKGROUND

1. Technical Field

The disclosed embodiment relates to a semiconductor integrated circuit, and in particular, to a semiconductor memory apparatus.

2. Related Art

The semiconductor memory apparatus transmits a plurality of parallel data bits over a long distance through a parallel data line called a data bus. The higher the integrated degree of the semiconductor memory apparatus, the narrower the interval between the data lines becomes, such that cross-talk noise between the data lines occurs.

Generally, the data bus is configured to include first to sixth repeaters 10 to 60 as shown in FIG. 1. At this time, for convenience of explanation, only two signal lines are shown in the data bus. Further, data input to the data bus are referred to as input data and data output from the data bus are referred to as output data.

A first input data 'data_in1' is output as a first output data 'data_out1' through the first to third repeaters 10 to 30. At this time, a data line, which outputs the first input data 'data_in1' as the first output data 'data_out1', is referred to as a first data line.

A second input data 'data_in2' is output as a second output data 'data_out2' through the fourth to sixth repeaters 40 to 60. At this time, a data line, which outputs the second input data 'data_in2' as the second output data 'data_out2', is referred to as a second data line.

The higher the integrated degree of the semiconductor memory apparatus, the narrower the interval between the first data line and the second data line becomes, such that cross-talk noise between the first data line and the second data line occurs.

A case when a change in a voltage level is the same in the first data line and the second data line will be described. For example, assume that data transmitted to the second repeater 20 through the first repeater 10 are transitioned from a high level to a low level. Moreover, assume that data transmitted from the fourth repeater 40 to the fifth repeater 50 are transitioned from a high level to a low level.

Since there is a parasitic capacitance between the first data line and the second data line, when the first data line (between the first repeater 10 and the second repeater 20) is transitioned from a high level to a low level, the change in the same voltage level also occurs in the second data line (between the fourth repeater 40 and the fifth repeater 50).

In contrast, when the second data line (between the fourth repeater 40 and the fifth repeater 50) is transitioned from a high level to a low level, the change in the same voltage level also occurs in the first data line (between the first repeater 10 and the second repeater 20).

The change in the same voltage level also occurs in the data line between the second repeater 20 and the third repeater 30 and the data line between the fifth repeater 50 and the sixth repeater 60.

Consequently, when the data having the same level are transmitted through the first data line and the second data line, the transition of the data occurs earlier than a normal case (jitter component occurs in data).

A case when a change in a voltage level is different in the first data line and the second data line will be described. For example, assume that data transmitted to the second repeater 20 through the first repeater 10 are transitioned from a high level to a low level. Meanwhile, assume that data transmitted from the fourth repeater 40 to the fifth repeater 50 are transitioned from a low level to a high level.

Since there is a parasitic capacitance between the first data line and the second data line, when the first data line (between the first repeater 10 and the second repeater 20) is transitioned from a high level to a low level, the change in the same voltage level also occurs in the second data line (between the fourth repeater 40 and the fifth repeater 50).

In contrast, when the second data line (between the fourth repeater 40 and the fifth repeater 50) is transitioned from a low level to a high level, the change in the same voltage level also occurs in the first data line (between the first repeater 10 and the second repeater 20).

The change in the same voltage level also occurs in the data line between the second repeater 20 and the third repeater 30 and the data line between the fifth repeater 50 and the sixth repeater 60.

Consequently, when data having a different voltage level are transmitted through the first data line and the second data line, the transition of data occurs later than a normal case (jitter components occur in data).

SUMMARY

The disclosed embodiment may provide a semiconductor memory apparatus capable of preventing the occurrence of jitter components in the data due to cross-talk noise between data lines.

A semiconductor memory apparatus according to the disclosed embodiment is configured to include: non-inversion repeaters that non-invert data and output the non-inverted data; and inversion repeaters that invert data and output the inverted data, wherein the non-inversion repeaters or the inversion repeaters are arranged on a first data line and a second data line at a predetermined distance, respectively, which are parallel with each other and are the most adjacent to each other and the non-inversion repeater or the inversion repeater is arranged at first positions corresponding to the first data line and the second data line, respectively, and the non-inversion repeaters are arranged on one of the first data line and the second data line while the inversion repeaters are arranged on the other of the first data line and the second data line, at second positions except for the first arrangement position of positions corresponding to the first data line and the second data line, respectively.

These and other features, aspects, and embodiments are described below in the period "Detailed Description."

BRIEF DESCRIPTION OF THE DRAWINGS

Features, aspects, and embodiments are described in conjunction with the attached drawings, in which.

DETAILED DESCRIPTION

Figure 1:
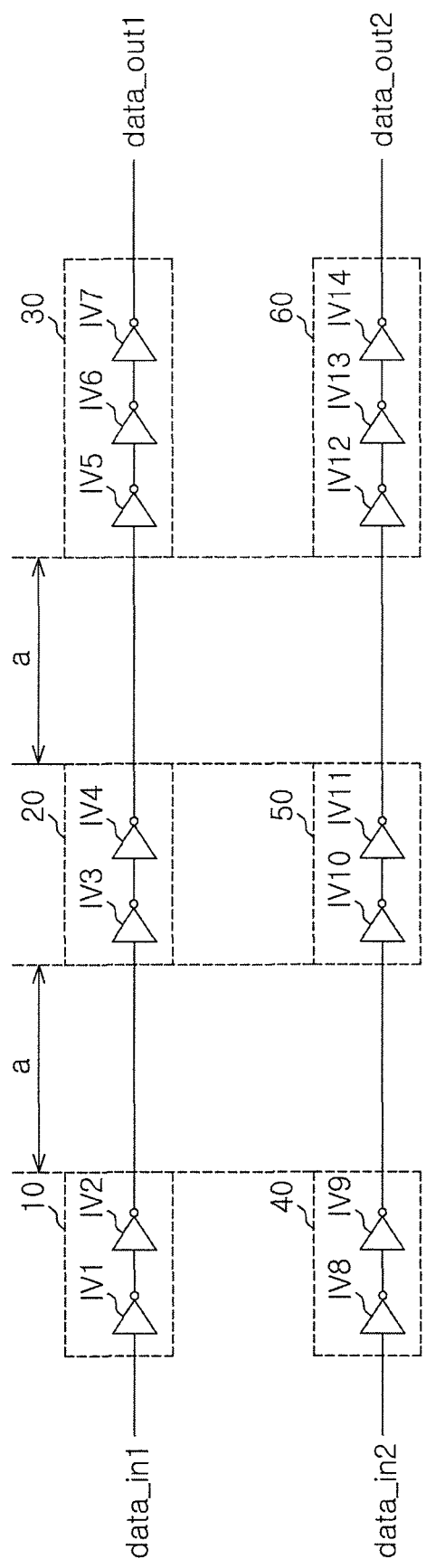
FIG. 1 is a configuration diagram of a general semiconductor memory apparatus.
Figure 2:
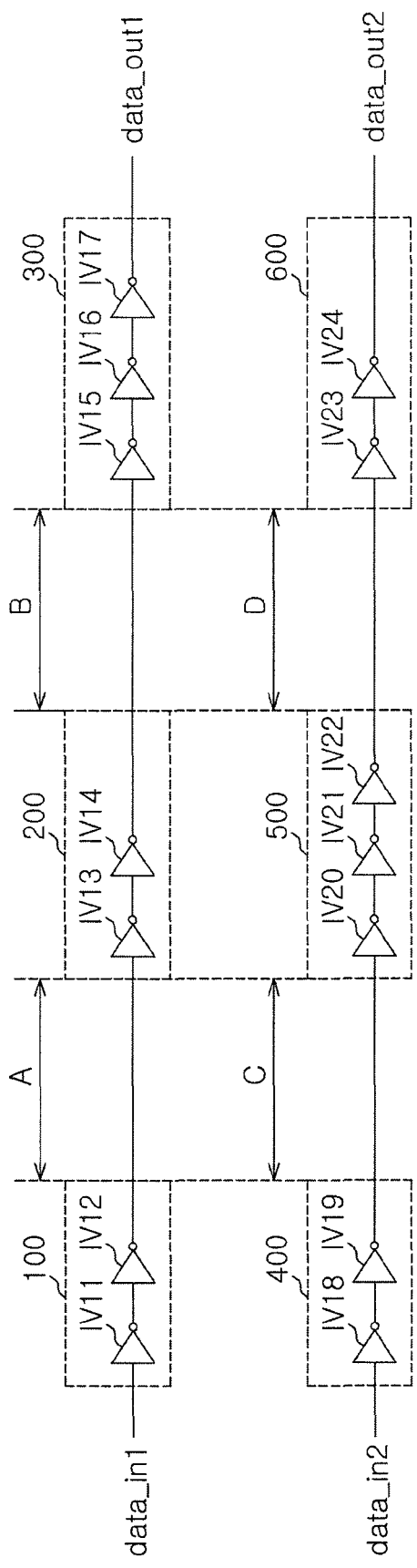
FIG. 2 is a diagram schematically showing a configuration of a semiconductor memory apparatus according to the disclosed embodiment.

A semiconductor memory apparatus according to the disclosed embodiment is a semiconductor memory apparatus that arranges repeaters on first and second data lines at a predetermined distance as shown in FIG. 2. The semiconductor memory apparatus sequentially arranges a non-inversion repeater 100, a non-inversion repeater 200, and an inversion repeater 300 on the first data line at a predetermined distance and sequentially arranges a non-inversion repeater 400, an inversion repeater 500, and a non-inversion repeater 600 on the second data line adjacent to the first data line at the predetermined distance. At this time, a data input to the first data line is referred to as a first input data 'data_in1', a data output from the first data line is referred to as a first output data 'data_out1', a data input to the second data line is referred to as a second input data 'data_in2', and a data output from the second data line is referred to as a second output data 'data_out2'.

Each of the non-inversion repeaters 100, 200, 400, and 600 is configured to include an even number of inverters, for example, inverters 'IV11, IV12', 'IV13, IV14', 'IV18, IV19', and 'IV23, IV24' that are connected in series.

Each of the inversion repeaters 300 and 500 is configured to include an odd number of inverters, for example, inverters 'IV15, IV16, IV17' and 'IV20, IV21, IV22' that are connected in series.

An example of the operation of the semiconductor memory apparatus configured as above according to the embodiment will be described.

In the first data line, between the non-inversion repeater 100 and the non-inversion repeater 200 is referred to as a first period 'A' and between the non-inversion repeater 200 and the inversion repeater 300 is referred to as a second period 'B'.

In the second data line, between the non-inversion repeater 400 and the non-inversion repeater 500 is referred to as a third period 'C' and between the inversion repeater 500 and the non-inversion repeater 600 is referred to as a fourth period 'D'. At this time, a length of the first to fourth periods 'A, B, C, and D' is the same, but may be different.

First, a case when there is the change in the same voltage level in the first data line and the second data line will be described. For example, the data 'data_in1, data_in2' input to the first data line and the second data line are transitioned from a high level to a low level.

The data transitioned from a high level to a low level are generated both in the first period 'A' and the third period 'C', such that the transition speed of data is quickened in the first period 'A' and the third period 'C'.

The data transitioned from a high level to a low level are generated in the second period 'B' and the data transitioned from a low level to a high level are generated in the fourth period 'D'. Therefore, the transition speed of data is slowed in the second period 'B' and the fourth period 'D'.

When there is the change in the same voltage level in the first data line and the second data line, the transition speed of data is quickened in the first period 'A' of the first data line and the transition speed of data is slowed in the second period 'B' thereof. The transition speed of data is quickened in the third period 'C' of the second data line and the transition speed of data is slowed in the fourth period 'D' thereof. Reviewing the first data line and second data line, the transition speed of data is quickened once and slowed once, respectively.

Second, a case when there is a change in a different voltage level in the first data line and the second data line will be described. For example, the data 'data_in1' input to the first data line is transitioned from a low level to a high level and the data 'data_in2' input to the second data line is transitioned from a high level to a low level.

The data transitioned from a low level to a high level are generated in the first period 'A' and the data transitioned from a high level to a low level are generated in the third period 'C', such that the transition speed of data is slowed in the first period 'A' and the third period 'C'.

The data transitioned from a low level to a high level are generated in the second period 'B' and the data transitioned from a low level to a high level are generated in the fourth period 'D'. Therefore, the transition speed of data is quickened in the second period 'B' and the fourth period 'D'.

When there is a change in a different voltage level in the first data line and the second data line, the transition speed of data is slowed in the first period 'A' of the first data line and the transition speed of data is quickened in the second period 'B' thereof. The transition speed of data is slowed in the third period 'C' of the second data line and the transition speed of data is quickened in the fourth period 'D' thereof. Reviewing the whole first data line and second data line, the transition speed of data is quickened once and slowed once, respectively.

When the voltage level of data input to the first data line and the second data line is transitioned at the same voltage level or at a different voltage level, the transition speed of data is quickened once and slowed once by the repeaters arranged on the first data line and the second data line at a predetermined distance.

Consequently, the semiconductor memory apparatus according to the disclosed embodiment can constantly maintain the transition speed of data regardless of the change in a voltage level of data. In other words, the transition speed of data output from each of the data line is constantly maintained (the jitter components between data do not occur).

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A semiconductor memory apparatus, comprising:
   non-inversion repeaters that non-invert data and output the non-inverted data; and
   inversion repeaters that invert data and output the inverted data, wherein the non-inversion repeaters and the inversion repeaters are arranged on a first data line and a second data line at a predetermined distance from each other, the first data line and the second data line are parallel with each other and the most adjacent to each other and one of the non-inversion repeaters or one of the inversion repeaters is arranged at first positions on the first data line and the second data line, respectively, and an other one of the non-inversion repeaters and an other one of the inversion repeaters are also arranged in alternating order on the first data line and in opposite alternating order on the second data line, respectively.

2. The semiconductor memory apparatus of claim 1, wherein the one and the other one of the non-inversion repeaters are configured to include an even number of inverters that are connected in series.

3. The semiconductor memory apparatus of claim 2, wherein the one and the other one of the inversion repeaters are configured to include an odd number of inverters that are connected in series.

4. The semiconductor memory apparatus of claim 3, wherein a total number of inverters arranged as the non-inversion repeaters and the inversion repeaters on the first data line and the second data line is the same.

* * * * *